(12) United States Patent  
Kim et al.

(10) Patent No.: US 7,715,261 B2  
(45) Date of Patent: May 11, 2010

(54) LAYOUT STRUCTURE OF SEMICONDUCTOR MEMORY DEVICE HAVING IOSA

(75) Inventors: Doo-Young Kim, Seongnam-si (KR); Byung-Chul Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 141 days.

(21) Appl. No.: 12/037,326

(22) Filed: Feb. 26, 2008

(65) Prior Publication Data

US 2008/0205177 A1 Aug. 28, 2008

(30) Foreign Application Priority Data

Feb. 27, 2007 (KR) .................. 10-2007-0019386

(51) Int. Cl.  
*G11C 7/00* (2006.01)

(52) U.S. Cl. ................. 365/205; 365/51; 365/63; 365/219; 365/230.03

(58) Field of Classification Search .................. 365/219  
See application file for complete search history.

(56) References Cited

U.S. PATENT DOCUMENTS

| | | | | |
|---|---|---|---|---|
| 4,807,191 A | * | 2/1989 | Flannagan | 714/711 |
| 5,243,574 A | * | 9/1993 | Ikeda | 365/207 |
| 6,061,290 A | * | 5/2000 | Shirley | 365/230.02 |
| 6,421,294 B2 | | 7/2002 | Hidaka | |
| 6,914,837 B2 | * | 7/2005 | Schroeder et al. | 365/205 |
| 7,167,409 B2 | * | 1/2007 | Akiyoshi | 365/230.03 |
| 7,248,513 B2 | * | 7/2007 | Ogura et al. | 365/200 |
| 7,489,576 B2 | * | 2/2009 | Hirota et al. | 365/208 |
| 2006/0126417 A1 | | 6/2006 | Akiyoshi | |

FOREIGN PATENT DOCUMENTS

| | | |
|---|---|---|
| KR | 20010070038 | 7/2001 |
| KR | 20040022905 | 3/2004 |

* cited by examiner

*Primary Examiner*—Tan T. Nguyen  
(74) *Attorney, Agent, or Firm*—Volentine & Whitt, PLLC

(57) ABSTRACT

Embodiments of the invention provide a layout for a semiconductor memory device that splits each memory bank into two blocks. Embodiments of the invention dispose input/output sense amplifiers between the two memory blocks to achieve relatively short global input/output lines to all areas of the memory bank. Shorter global input/output lines have less loading and therefore enable higher-speed data transfer rates. Some embodiments of the invention include column selection line repeaters between the two memory blocks. The column selection line repeaters reduce loading in the column selection lines, and increase column selection speed. Embodiments of the invention include both input/output sense amplifiers and column selection line repeaters disposed between the two memory blocks to increase data transfer rates on the global input/output lines and also increase column selection speed.

19 Claims, 7 Drawing Sheets

LAYOUT STRUCTURE OF SEMICONDUCTOR MEMORY DEVICE HAVING IOSA

CROSS REFERENCE TO RELATED APPLICATIONS

This application claims priority under 35 U.S.C. §119 from Korean Patent Application 10-2007-0019386, filed on Feb. 27, 2007, the contents of which are hereby incorporated by reference in their entirety for all purposes as if fully set forth herein.

BACKGROUND OF THE INVENTION

1. Field of the Invention

The present invention relates to semiconductor memory devices, and more particularly but not by way of limitation, to a layout structure of semiconductor memory device having an input/output sense amplifier.

2. Description of Related Art

Semiconductor memory devices widely used in computers and communication products etc. are based on a hierarchy of local input/output lines (LIO) and global input/output lines (GIO). FIG. 1 illustrates a layout of semiconductor memory device having such a hierarchical structure according to a conventional art.

Referring to FIG. 1, a conventional semiconductor memory device 100 layout includes a plurality of memory banks A, B, C, D, E, F, G and H and a corresponding plurality of column decoders 110, row decoders 130, column control and fuse circuits 112, and row control circuits 132.

A column decoder 110 associated with each memory bank is positioned near one side of each memory bank, and a row decoder 130 is positioned near another side of each memory bank. A column control and fuse circuit 112 for a redundancy and control of the column decoder is positioned adjacent to each column decoder 110, and a row control circuit 132 for a control of the row decoder 130 is positioned adjacent to each row decoder 130.

Peripheral circuit area 170 includes multiple input/output sense amplifier (IOSA) areas. For example input/output sense amplifier area 150 is disposed in the peripheral circuit area 170 between memory bank A and memory bank E. The input/output sense amplifier area 150 includes multiple input/output sense amplifiers (not shown). Each of the input/output sense amplifiers in input/output sense amplifier area 150 are connected to a global input/output line GIO of the memory bank A and a global input/output line GIO of the memory bank E. That is, the memory bank A and the memory bank E share the input/output sense amplifiers included in input/output sense amplifier area 150.

The layout structure of semiconductor memory device as described above is generally well known in the art, thus further detail will be omitted.

FIG. 2 illustrates a data read path in a semiconductor memory device according to a conventional art. As illustrated in FIG. 2, a word line of selected memory cell MC is enabled and so data is developed into a bit line BL. A bit line sense amplifier BLSA senses and amplifies the data. The data output from the bit line sense amplifier BLSA is transferred through a local input/output line LIO to a multiplexer IOMUX. The data is transferred through the global input/output line GIO to the input/output sense amplifier IOSA. The input/output sense amplifier IOSA senses and amplifies the data, converts it into a CMOS level, and transmits it through a first data line FDIO. The data transmitted through the first data line FDIO is converted into serial data through a parallel to serial transformer (RDORDER) and then is transmitted to the data pad DQ and output from the memory device. In some conventional applications, a data output buffer (not shown) may be used prior to transmitting the data to the data pad DQ.

There is a need for highly-integrated semiconductor memory devices with faster data transfer speeds.

SUMMARY OF THE INVENTION

It is desirable to modify the semiconductor device layout of FIG. 1 in a way that speeds the data read path depicted in FIG. 2 and/or improves layout density.

Toward that end, it is recognized that some global input/output lines of conventional semiconductor memory devices are relatively long. For example, with reference to FIG. 1, global input/output line GIOL connected from input/output sense amplifier area 150 to a memory cell in area Aa is relatively long compared to the length of global input/output line GIOS that is connected from the input/output sense amplifier area 150 to a memory cell in memory area Ab. Longer global input/output lines GIO increase loading and slow data transmission. Embodiments of the invention address this shortcoming by providing a layout that splits each memory bank into two blocks, and disposes input/output sense amplifiers between the two memory blocks to achieve relatively short GIO lines to all areas of the memory banks. As a result, line loading in global input/output lines can be decreased, and data transfer speeds can be increased.

It is further observed that conventional layouts include long column selection lines. For example, with reference to FIG. 1 a column selection line from column decoder 110 to a memory cell in memory area Aa is relatively long compared to the length of a column selection line to a memory cell in memory area Ab. Longer column selection lines translate to increased loading and slower operation. Embodiments of the invention address this shortcoming by providing a layout that splits each memory bank into two blocks and includes column selection line repeaters between the two memory blocks. As a result, line loading in column selection lines can be decreased, and operating speeds can be increased.

Embodiments of the invention provide a semiconductor memory device that includes: a first input/output sense amplifier area having a first plurality of input/output sense amplifiers; and a memory bank including a first memory block and a second memory block, the memory bank configured to be fully addressed by a first row decoder and a first column decoder, the first input/output sense amplifier area being disposed between the first memory block and the second memory block, the first memory block having a first plurality of data lines, the second memory block having a second plurality of data lines, each of the first plurality of input/output sense amplifiers being associated with a corresponding one of the first plurality of data lines and a corresponding one of the second plurality of data lines.

Embodiments of the invention provide a semiconductor memory device that includes: a first input/output sense amplifier area having a first plurality of input/output sense amplifiers; a second input/output sense amplifier area having a second plurality of input/output sense amplifiers; a first memory bank including a first memory block and a second memory block, the first memory bank configured to be fully addressed by a first row decoder and a first column decoder, the first input/output sense amplifier area being disposed between the first memory block and the second memory block, the first memory block coupled to the first plurality of sense amplifiers, the second memory block coupled to the second plurality of sense amplifiers; and a second memory bank including a third memory block and a fourth memory block, the second memory bank configured to be fully addressed by a second row decoder and a second column decoder, the second input/output sense amplifier area being disposed between the second memory block and the third memory block, the third memory block coupled to the second plurality of sense amplifiers.

BRIEF DESCRIPTION OF THE DRAWINGS

The present invention will become more fully understood from the detailed description given herein below and the accompanying drawings which are given by way of illustration only, and thus are not limitative of the present invention, and wherein.

DESCRIPTION OF THE EMBODIMENTS

Embodiments of the present invention now will be described more fully hereinafter with reference to FIGS. 3 to 7, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
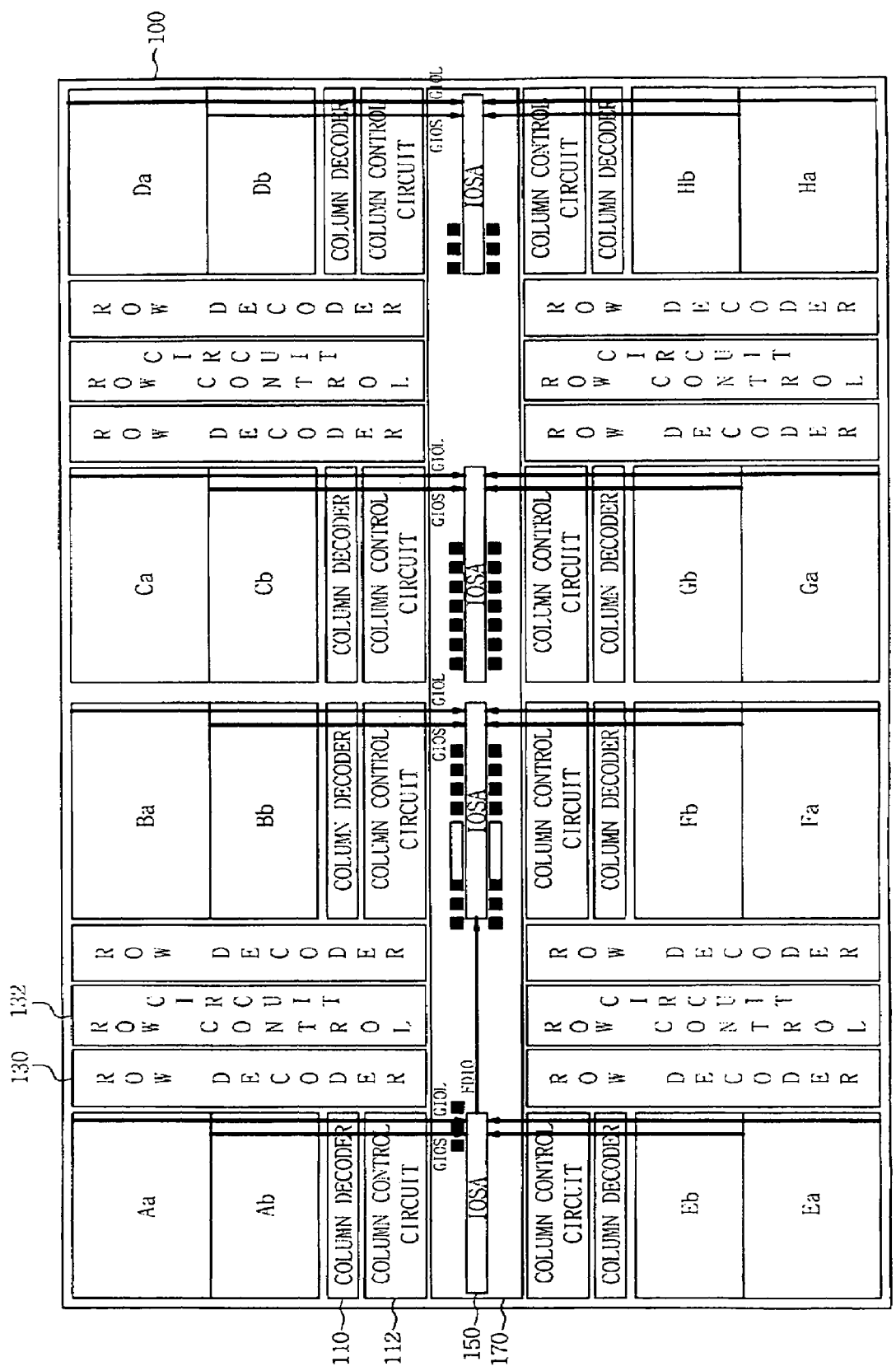
FIG. 1 illustrates a layout of semiconductor memory device according to a conventional art.
Figure 2:
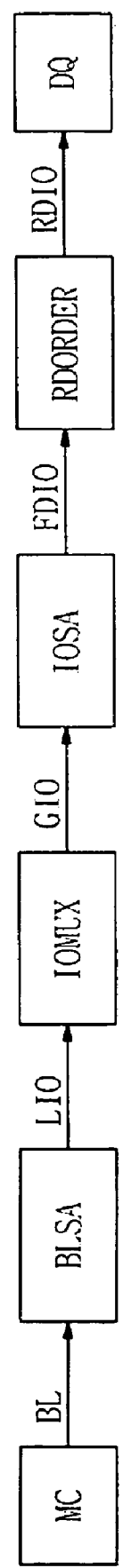
FIG. 2 is a block diagram illustrating a data read path of a semiconductor memory device according to a conventional art.
Figure 3:
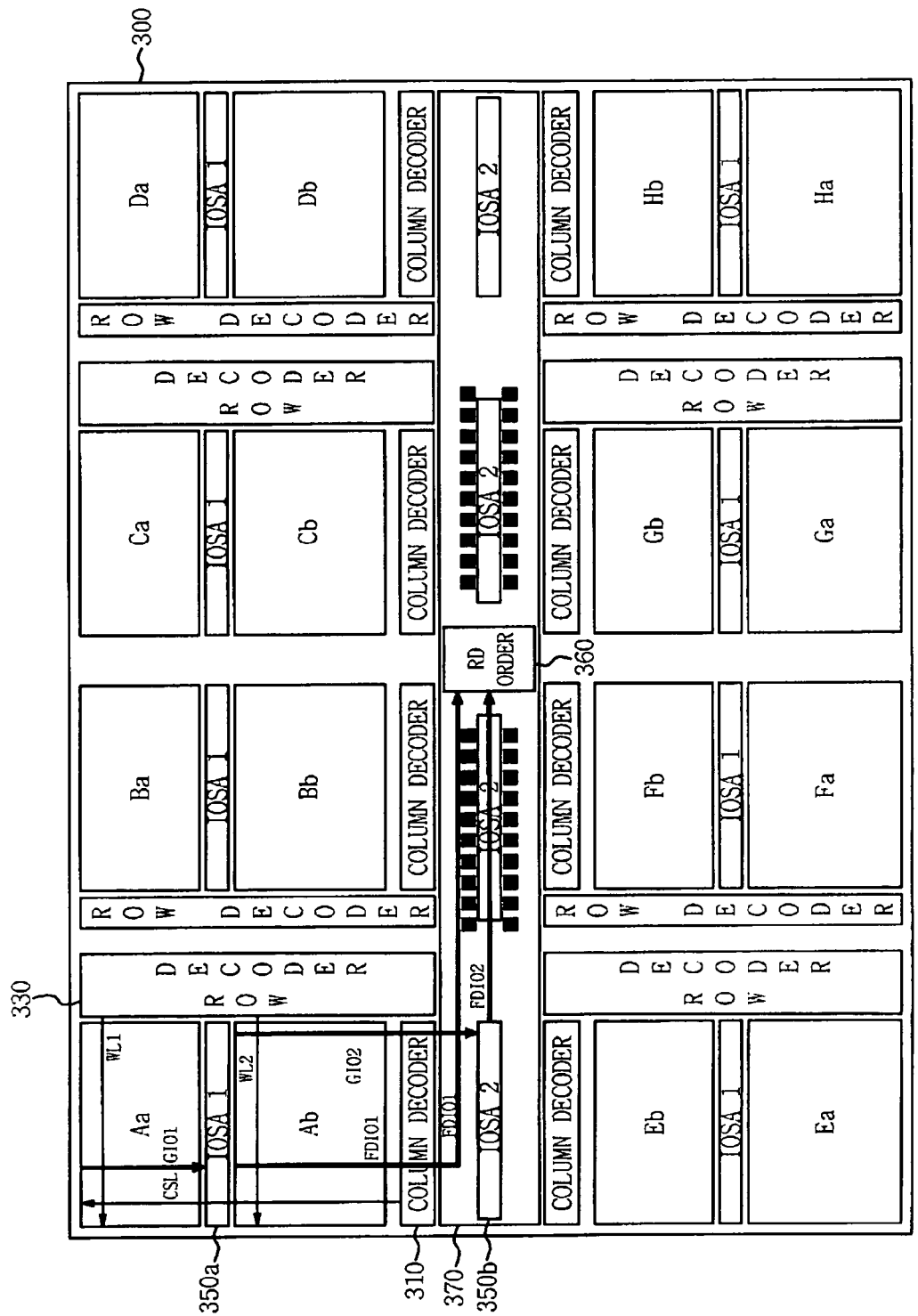
FIGS. 3 to 7 illustrate layout structures of a semiconductor memory device according to some embodiments of the invention.

FIG. 3 illustrates a layout structure of semiconductor memory device 300 according to an embodiment of the invention.

Referring to FIG. 3, a semiconductor memory device 300 according to an embodiment of the invention comprises a plurality of memory banks A, B, C, D, E, F, G, and H, each being divided into at least two memory blocks. For instance, memory bank A is divided into memory blocks Aa and Ab, and memory bank B is divided into memory blocks Ba and Bb. Further, two of memory banks A, B, C, D, E, F, and G may be classified as one memory bank.

Although in FIG. 3 there is only the example of a memory bank divided into two memory blocks, a memory bank may alternatively be divided into more than two memory blocks, according to design choice.

The memory device 300 also includes multiple column decoders and multiple row decoders such that a column decoder and a row decoder are associated with each memory bank. For instance, a column decoder 310 is disposed on one side of memory bank A, and a row decoder 330 is disposed on another side of memory bank A. A column control and fuse circuit (not shown) for a control and redundancy of the column decoder may be added adjacent to the column decoder 310. A row control circuit (not shown) for a control of the row decoder 330 may be also be disposed adjacent to the row decoder 330.

A peripheral circuit area 370 includes peripheral circuits and is similar to the layout of peripheral circuit area 170 in the conventional semiconductor memory device 100.

A first input/output sense amplifier (IOSA1) area 350a is formed between the two memory blocks Aa and Ab. Multiple input/output sense amplifiers (not shown) may be disposed in the first input/output sense amplifier area 350a. The number of first input/output sense amplifiers (not shown) included in first input/output sense amplifier area 350a corresponds to the number of global input/output lines GIO associated with memory block Aa. That is, each of the first input/output sense amplifiers in input/output sense amplifier area 350a are coupled to a corresponding global input/output line GIO associated with memory block Aa.

A second input/output sense amplifier (IOSA2) area 350b is formed in the peripheral circuit area 370. Multiple input/output sense amplifiers (not shown) may be disposed in the second input/output sense amplifier area 350b. The number of input/output sense amplifiers in the second input/output sense amplifier area 350b corresponds to the number of global input/output lines GIO associated with memory block Ab. That is, each of the input/output sense amplifiers in the input/output sense amplifier area 350b are coupled to a corresponding global input/output line GIO associated with memory block Ab.

Memory blocks Aa and Ab may have the same size and structure. In this instance, the number of the first input/output sense amplifiers in the first input/output sense amplifier area 350a equals the number of input/output sense amplifiers in the second input/output sense amplifier area 350b.

Each of the input/output sense amplifiers in the second input/output sense amplifier area 350b are also coupled to a corresponding global input/output line GIO of memory block Eb. Memory block Eb is a portion of memory bank E that is near the second input/output sense amplifier area 350b. Thus, each of the input/output sense amplifiers in the second input/output sense amplifier area 350b are shared by a global input/output line GIO of the memory block Ab and a global input/output line GIO of the memory block Eb.

The layout structure of memory bank A and input/output sense amplifier areas 350a and 350b described above may be applied similarly to memory banks B, C, D, E, F, G and H.

When a memory cell of the memory block Aa is selected by a word line WL1 and a column selection line CSL is selected by a column selection signal, data of the selected memory cell is transmitted to a first global input/output line GIO1 through a local input/output line (not shown). The data transmitted to the first global input/output line GIO1 is sensed and amplified by an input/output sense amplifier included in the first input/output sense amplifier area 350a, and then is output to a data line FDIO1. The data transmitted to the data line FDIO1 is converted into a serial data through a parallel-to-serial converter RDORDER 360 and then is output from the semiconductor memory device 300.

When a memory cell of the memory block Ab is selected by a word line WL2 and the column selection line CSL, data of the selected memory cell is transmitted to a second global input/output line GIO2 through a local input/output line (not shown). The data transmitted to the second global input/output line GIO2 is sensed and amplified by an input/output sense amplifier included in the second input/output sense amplifier area 350b, then is output to a data line FDIO2. The data transmitted to the data line FDIO2 is converted into a serial data through the parallel-to-serial converter RDORDER 360 and then is output from the memory device 300.

The layout described above with reference to FIG. 3 can reduce loading on the global input/output line GIO by approximately one half compared to the conventional art. As a result, data transmission speeds can be increased.

Figure 4:
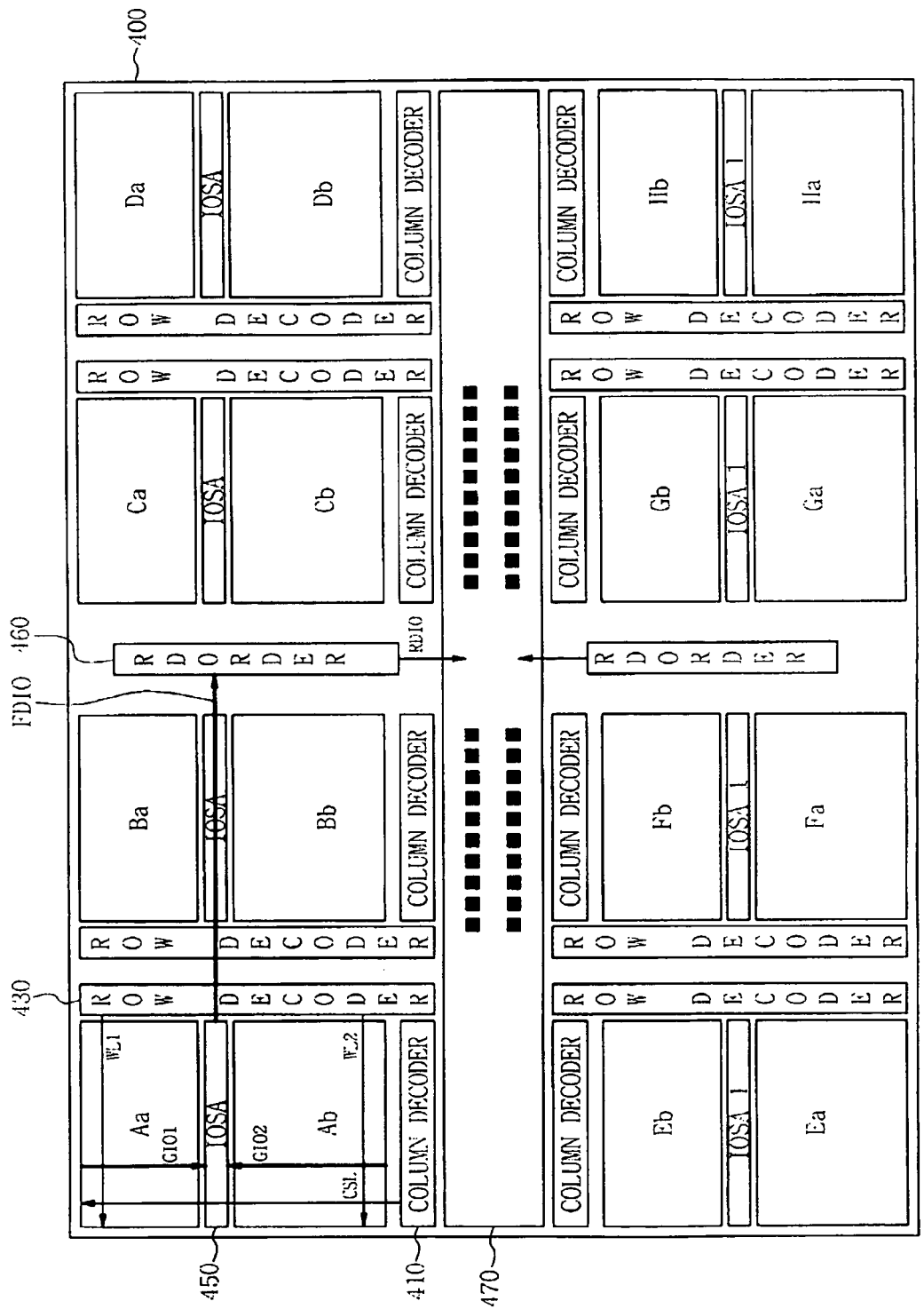

FIG. 4 illustrates a layout structure of semiconductor memory device 400 according to another embodiment of the invention.

With reference to FIG. 4, all required input/output sense amplifiers (not shown) are disposed in an input/output sense amplifier area 450 adapted between two memory blocks. As illustrated in FIG. 4, input/output sense amplifiers are not disposed in peripheral circuit area 470. Other features of the semiconductor memory device 400 layout are the same as described above with respect to the layout in FIG. 3.

The layout of semiconductor memory device 400 is described below using the example of memory bank A.

The memory bank A is divided into two memory blocks, Aa and Ab. An input/output sense amplifier area 450 is formed between memory blocks Aa and Ab. The input/output sense amplifier area 450 includes multiple input/output sense amplifiers (not shown). The number of input/output sense amplifiers included in input/output sense amplifier area 450 corresponds to the number of all global input/output lines GIO associated with memory blocks Aa and Ab.

The layout structure of memory bank A and input/output sense amplifier area 450 described above may be applied equally to memory banks B, C, D, E, F, G and H.

When a memory cell of the memory block Aa is selected by a word line WL1 and a column selection line CSL selected by a column selection signal, data of the selected memory cell is transmitted to first global input/output line GIO1 through a local input/output line (not shown). The data transmitted to the first global input/output line GIO1 is sensed and amplified by an input/output sense amplifier included in the input/output sense amplifier area 450, then is output to data line FDIO. The data transmitted to the data line FDIO is converted into a serial data through a parallel-to-serial converter RDORDER 460 and then is output from the semiconductor memory device 400.

When a memory cell of the memory block Ab is selected by a word line WL2 and the column selection line CSL, data of the selected memory cell is transmitted to a second global input/output line GIO2 through a local input/output line (not shown). The data transmitted to the second global input/output line GIO2 is sensed and amplified by an input/output sense amplifier included in input/output sense amplifier area 450, then is output to data line FDIO. The data transmitted to the data line FDIO is converted into a serial data through the parallel-to-serial converter RDORDER 460 and then is output from the semiconductor memory device 400.

The parallel-to-serial converter RDORDER 460 may be disposed between a memory bank B and a memory bank C (as shown). In an alternative embodiment, one or more parallel-to-serial converters RDORDER may be disposed in the peripheral circuit area 470 instead of being disposed in areas outside of the peripheral circuit area 470.

The layout described above with reference to FIG. 4 can reduce loading of input/output line GIO by approximately one half compared to the conventional art. As a result, data transmission speed can be increased.

Figure 5:
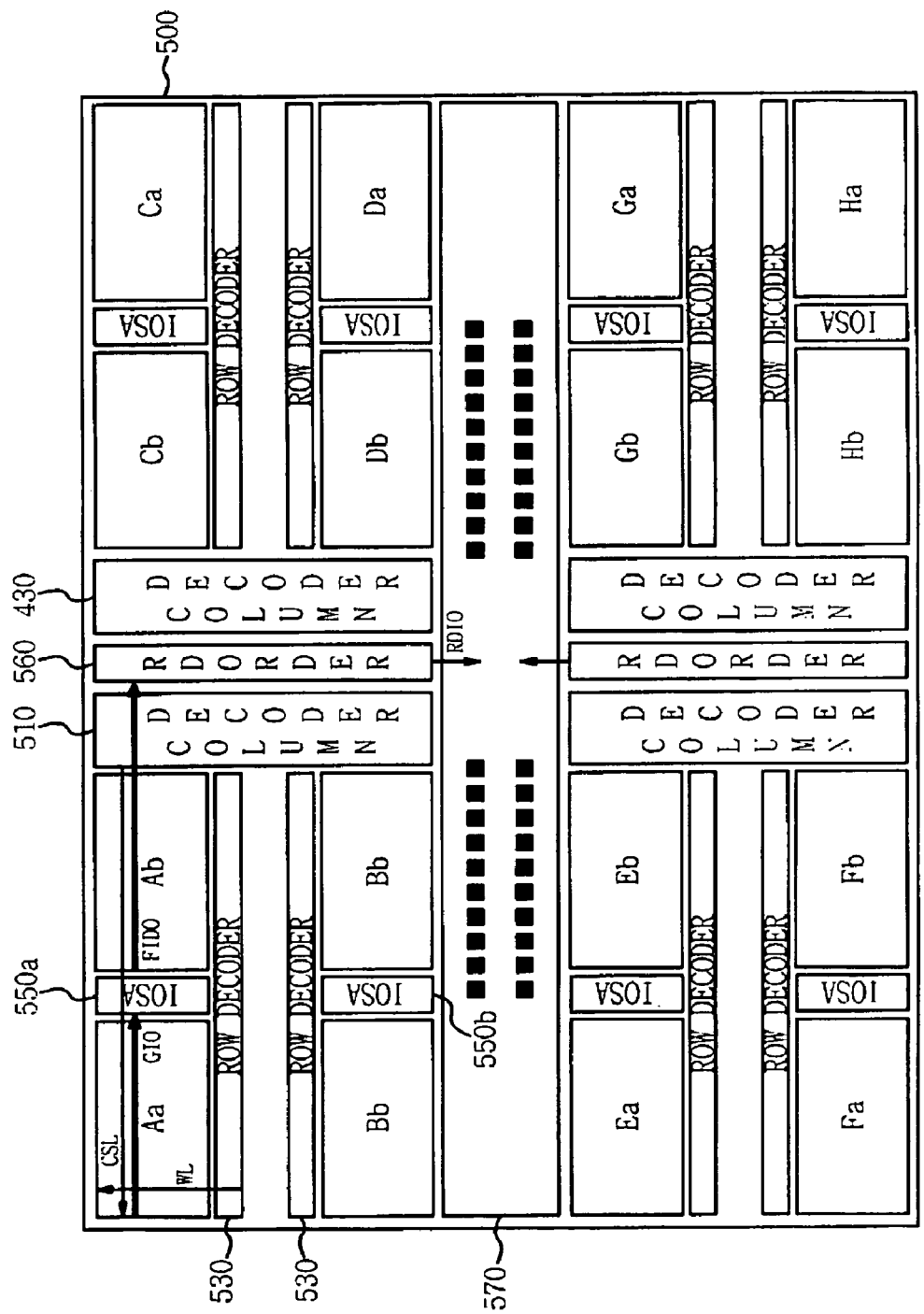

FIG. 5 illustrates a layout structure of semiconductor memory device 500 according to another embodiment of the invention.

In the embodiments of FIGS. 3 and 4, memory banks A~H are all disposed adjacent to the peripheral circuit area, column decoders are disposed so that the longitudinal axes of the column decoder areas are parallel to the longitudinal axis of the peripheral circuit area, and row decoders are formed so that the longitudinal axes of the row decoder areas are perpendicular to the longitudinal axis of the peripheral circuit area. By contrast, in the embodiment of FIG. 5, a column decoder area 510 is positioned so that its longitudinal axis is perpendicular to a longitudinal axis of the peripheral circuit area 570, and row decoder areas 530 are disposed so that their longitudinal axes are parallel to the longitudinal axis of peripheral circuit area 570.

The embodiment illustrated in FIG. 5 is further described below with reference to memory bank A and memory bank B. Memory banks A and B are located in an upper part of the semiconductor memory device 500. A first side of memory bank B is adjacent to the peripheral circuit area 570. Memory bank A is near a side of memory bank B that is opposite the first side of memory bank B. Memory bank A is divided into memory blocks Aa and Ab, and memory bank B is divided into memory blocks Ba and Bb. In an alternative embodiment, memory banks A and/or B could be divided into more than two memory blocks.

In the embodiment illustrated in FIG. 5, an input/output sense amplifier block IOSA is disposed in an area 550*a* between memory blocks Aa and Ab, and an input/output sense amplifier block IOSA is likewise disposed in an area 550*b* between memory blocks Ba and Bb. Such placement of the input sense amplifier blocks minimizes the length of global input/output lines GIO.

The layout of memory banks C and D, E and F, and G and H are substantially similar to that described above for memory blocks A and B.

When a memory cell of the memory block Aa is selected by a word line WL and a column selection line CSL selected by a column selection signal, data of the selected memory cell is transmitted to global input/output line GIO through a local input/output line (not shown). The data transmitted to the global input/output line GIO is sensed and amplified by an input/output sense amplifier included in the input/output sense amplifier block IOSA in the input/output sense amplifier area 550*a*, then is output to data line FDIO. The data transmitted to the data line FDIO is converted into a serial data through parallel-to-serial converter RDORDER 560 and then is output from the semiconductor memory device 500 through data line RDIO.

As illustrated in FIG. 5, the parallel-to-serial converter RDORDER 560 may be disposed so that its longitudinal axis is perpendicular with respect to the longitudinal axis of the peripheral circuit area 570. The parallel-to-serial converter RDORDER 560 is also adjacent to the column decoder area 510 such that the longitudinal axis of the parallel-to-serial converter RDORDER 560 is parallel to the longitudinal axis of the column decoder area 510. Such placement of the parallel-to-serial converter RDORDER 560 advantageously minimizes the length of data line FDIO.

Figure 6:
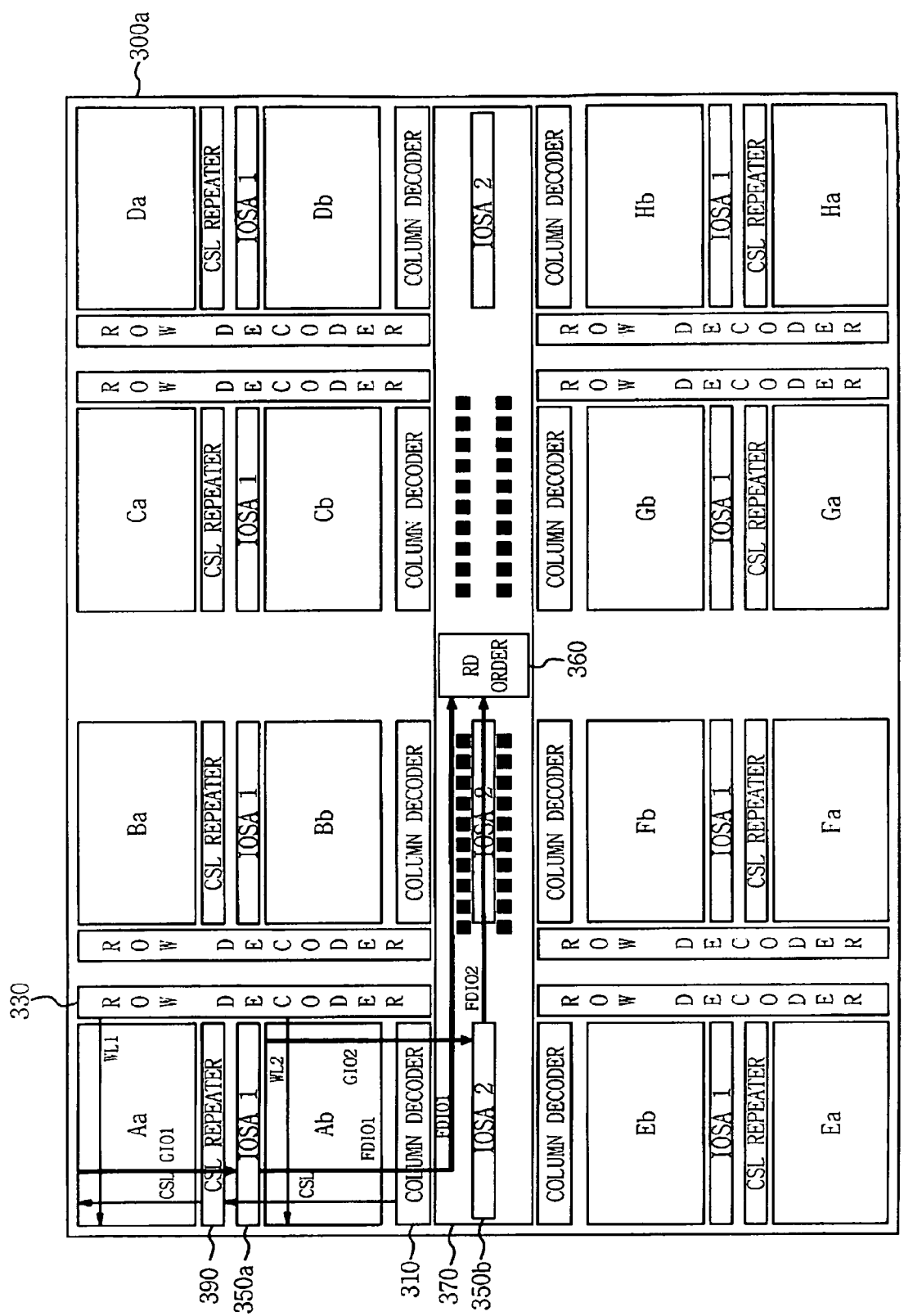

FIG. 6 illustrates a layout structure of semiconductor memory device 300*a* according to another embodiment of the invention.

As shown in FIG. 6, the semiconductor memory device 300*a* has the same layout structure as the semiconductor memory device 300 in FIG. 3, except that column selection line (CSL) repeater areas are added. Thus, only the added CSL repeater feature is described here.

With reference to memory bank A, a CSL repeater area 390 is located adjacent to first input/output sense amplifier area 350a and between memory blocks Aa and Ab. A plurality of CSL repeaters (not shown) may be disposed in the CSL repeater area 390. The number of CSL repeaters in CSL repeater area 390 may correspond to the number of column selection lines CSL disposed in the memory bank A.

Each of the CSL repeaters in the CSL repeater area 390 is configured to buffer and relay a column selection signal on a column selection line CSL. This configuration reduces loading of a column selection signal that is transmitted to memory block Aa from a column decoder in the column decoder area 310. CSL repeaters may therefore improve column selection speed.

Each of the CSL repeaters in the CSL repeater area 390 may be or include, for example, two inverters that are connected in series.

Figure 7:
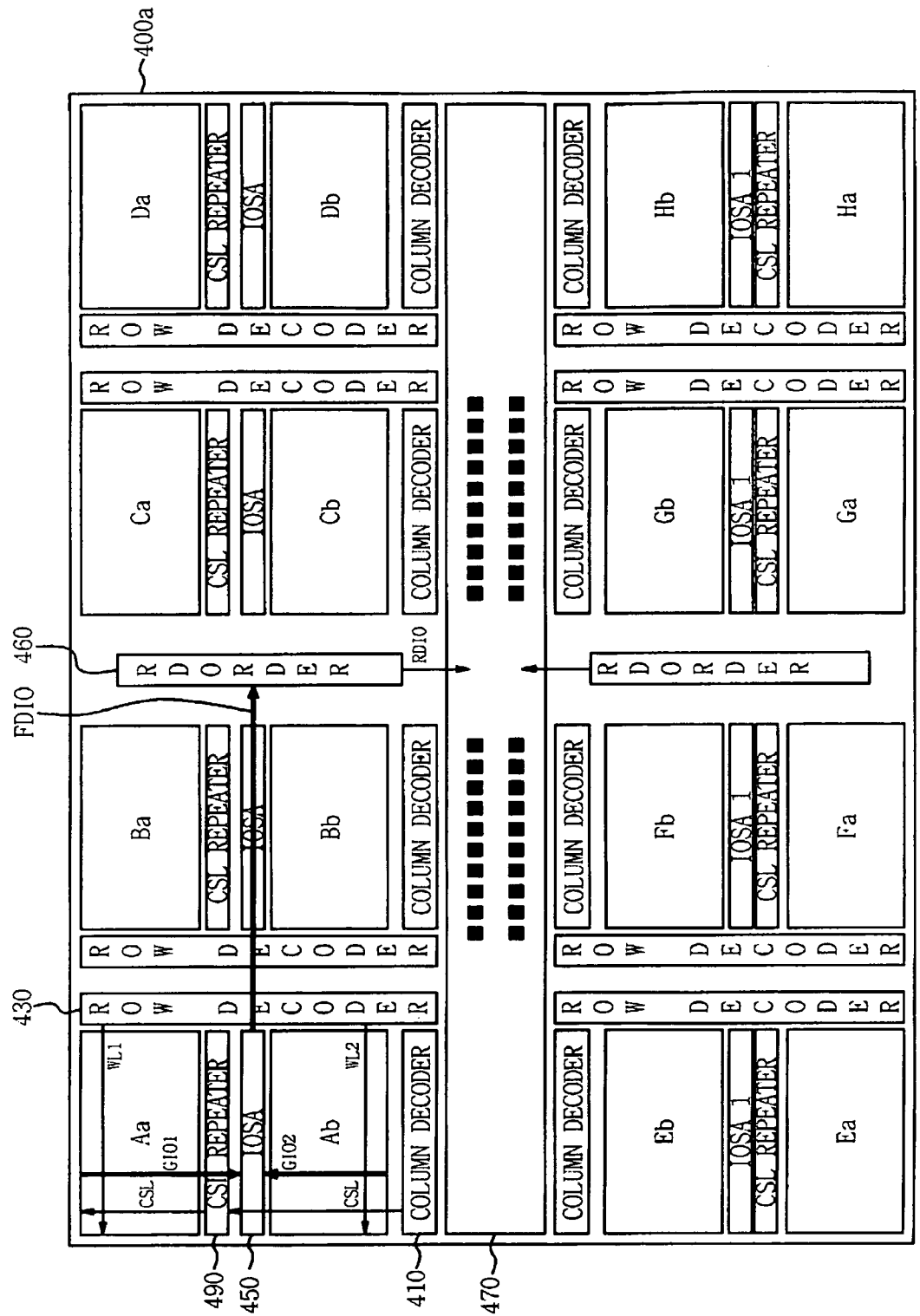

FIG. 7 illustrates a layout structure of semiconductor memory device 400a according to another embodiment of the invention.

As shown in FIG. 7, the semiconductor memory device 400a has the same layout structure as the semiconductor memory device 400 in FIG. 4, except that CSL repeater areas are added. Thus, only the added CSL repeater feature is described here.

With reference to memory bank A, a CSL repeater area 490 is located adjacent to input/output sense amplifier area 450 and between memory blocks Aa and Ab. A plurality of CSL repeaters (not shown) may be disposed in the CSL repeater area 490. The number of CSL repeaters in CSL repeater area 490 may correspond to the number of column selection lines CSL disposed in the memory bank A.

Each of the CSL repeaters in the CSL repeater area 490 is configured to buffer and relay a column selection signal on a column selection line CSL. This configuration reduces loading of a column selection signal that is transmitted to memory block Aa from a column decoder in the column decoder area 410. CSL repeaters may therefore improve column selection speed.

Each of the CSL repeaters in the CSL repeater area 490 may be or include, for example, two inverters that are connected in series.

As described above, embodiments of the invention provide a layout for a semiconductor memory device that decreases loading on global input/output lines GIO and/or column selection lines CSL, thus enabling higher operating frequencies.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents.

What is claimed is:

1. A semiconductor memory device, comprising:
a first input/output sense amplifier area having a first plurality of input/output sense amplifiers;
a memory bank including a first memory block and a second memory block, the memory bank configured to be fully addressed by a first row decoder and a first column decoder, the first input/output sense amplifier area being disposed between the first memory block and the second memory block, the first memory block having a first plurality of data lines, the second memory block having a second plurality of data lines, each of the first plurality of input/output sense amplifiers being associated with a corresponding one of the first plurality of data lines and a corresponding one of the second plurality of data lines;
a peripheral circuit area adjacent to the first column decoder; and
a parallel-to-serial transformer area coupled to the first input/output sense amplifier area, the parallel-to-serial transformer area being outside the peripheral circuit area.

2. The semiconductor memory device of claim 1, wherein the first and second plurality of data lines are global input/output lines.

3. The semiconductor memory device of claim 1, wherein the peripheral circuit area does not include the first input/output sense amplifier area.

4. The semiconductor memory device of claim 3, further comprising a second input/output sense amplifier area, wherein the peripheral circuit area does not include the second input/output sense amplifier area.

5. The semiconductor memory device of claim 1, wherein the peripheral circuit area is vertically aligned with a plurality of data pads, the plurality of data pads being coupled to the parallel-to-serial transformer area.

6. The semiconductor memory device of claim 1, further comprising a plurality of column selection line repeaters disposed between the first memory block and the second memory block, the plurality of column selection line repeaters coupled to the first memory block and the second memory block.

7. The semiconductor memory device of claim 6, wherein the first memory block and the second memory block include a plurality of column selection lines, the plurality of column selection lines being coupled to the first column decoder, each of the plurality of column selection line repeaters configured to receive and buffer a column selection signal from a corresponding one of the plurality of column selection lines on the first memory block and output the received and buffered column selection signal to the corresponding one of the plurality of column selection lines on the second memory block.

8. The semiconductor memory device of claim 7, wherein each of the plurality of column selection line repeaters includes two serially-connected inverters.

9. The semiconductor memory device of claim 1 further comprising a second input/output sense amplifier area, the second input/output sense amplifier area including a second plurality of input/output sense amplifiers, the memory bank including a third memory block and a fourth memory block, the second input/output sense amplifier area being disposed between the third memory block and the fourth memory block, the third memory block including a third plurality of data lines, the fourth memory block including a fourth plurality of data lines, each of the second plurality of input/output sense amplifiers being coupled to a corresponding one of the third plurality of data lines and a corresponding one of the fourth plurality of data lines.

10. The semiconductor memory device of claim 9, wherein the first, second, third, and fourth plurality of data lines are global input/output lines.

11. The semiconductor memory device of claim 9, further comprising:
a first plurality of column selection line repeaters disposed between the first memory block and the second memory block, the first plurality of column selection line repeaters coupled to the first memory block and the second memory block; and
a second plurality of column selection line repeaters disposed between the third memory block and the fourth memory block, the second plurality of column selection line repeaters coupled to the third memory block and the fourth memory block.

12. The semiconductor memory device of claim 11, wherein each of the first and second plurality of column selection line repeaters includes two serially-connected inverters.

13. A semiconductor memory device, comprising:
a first input/output sense amplifier area having a first plurality of input/output sense amplifiers;
a second input/output sense amplifier area having a second plurality of input/output sense amplifiers;
a first memory bank including a first memory block and a second memory block, the first memory bank configured to be fully addressed by a first row decoder and a first column decoder, the first input/output sense amplifier area being disposed between the first memory block and the second memory block, the first memory block coupled to the first plurality of sense amplifiers, the second memory block coupled to the second plurality of sense amplifiers; and
a second memory bank including a third memory block and a fourth memory block, the second memory bank configured to be fully addressed by a second row decoder and a second column decoder, the second input/output sense amplifier area being disposed between the second memory block and the third memory block, the third memory block coupled to the second plurality of sense amplifiers.

14. The semiconductor memory device of claim 13, wherein the second input/output sense amplifier area is disposed in a peripheral circuit area.

15. The semiconductor memory device of claim 13, further comprising a third input/output sense amplifier area having a third plurality of input/output sense amplifiers, the third input/output sense amplifier area being disposed between the third memory block and the fourth memory block, the third plurality of input/output sense amplifiers coupled to the fourth memory block.

16. The semiconductor memory device of claim 15, wherein the first memory block includes a first plurality of data lines, the second memory block includes a second plurality of data lines, the third memory block includes a third plurality of data lines, the fourth memory block includes a fourth plurality of data lines, each of the first plurality of data lines being coupled to a corresponding one of the first plurality of input/output sense amplifiers, each of the second and third plurality of data lines being coupled to a corresponding one of the second plurality of input/output sense amplifiers, each of the fourth plurality of data lines being coupled to a corresponding one of the third plurality of input/output sense amplifiers.

17. The semiconductor memory device of claim 16, wherein the first, second, third, and fourth plurality of data lines are global input/output lines.

18. The semiconductor memory device of claim 16, further comprising:
a first plurality of column selection repeaters disposed between the first memory block and the second memory block, the first plurality of column selection line repeaters coupled to the first column decoder and the first memory block; and
a second plurality of column selection line repeaters disposed between the third memory block and the fourth memory block, the second plurality of column selection line repeaters coupled to the second column decoder and the fourth memory block.

19. The semiconductor memory device of claim 18, wherein each of the first and second plurality of column selection line repeaters includes two serially-connected inverters.

* * * * *